(12) United States Patent
Jung

(10) Patent No.: US 8,110,340 B2
(45) Date of Patent: Feb. 7, 2012

(54) METHOD OF FORMING A PATTERN OF A SEMICONDUCTOR DEVICE

(75) Inventor: Woo Yung Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 434 days.

(21) Appl. No.: 12/132,551

(22) Filed: Jun. 3, 2008

(65) Prior Publication Data

US 2009/0170031 A1   Jul. 2, 2009

(30) Foreign Application Priority Data

Dec. 28, 2007   (KR) .................. 10-2007-140295

(51) Int. Cl.
*G03F 7/00* (2006.01)
*G03F 7/26* (2006.01)
*G03F 7/40* (2006.01)

(52) U.S. Cl. .................. 430/312; 430/270.1; 430/271.1; 430/311; 430/322; 430/317; 430/331

(58) Field of Classification Search .............. 430/311, 430/312, 270.1, 271.1, 322, 317, 331
See application file for complete search history.

(56) References Cited

U.S. PATENT DOCUMENTS

| | | | |
|---|---|---|---|
| 7,666,578 B2 * | 2/2010 | Fischer et al. | 430/314 |
| 2005/0170625 A1 * | 8/2005 | Cong et al. | 438/597 |
| 2006/0216649 A1 * | 9/2006 | Paxton et al. | 430/311 |
| 2007/0026680 A1 * | 2/2007 | Hong | 438/700 |
| 2008/0124931 A1 * | 5/2008 | Lee et al. | 438/692 |
| 2009/0081563 A1 * | 3/2009 | Wang et al. | 430/5 |

FOREIGN PATENT DOCUMENTS

| | | |
|---|---|---|
| KR | 1020060110097 A | 10/2006 |
| KR | 100672123 B1 | 1/2007 |
| KR | 100790998 B1 | 12/2007 |

* cited by examiner

*Primary Examiner* — Amanda C. Walke
(74) *Attorney, Agent, or Firm* — Kilpatrick Townsend & Stockton LLP

(57) ABSTRACT

A pattern for a gate line is formed using a first photoresist pattern and a first BARC layer. A pad and patterns for a select line, which has a width that is larger than that of the gate line, are formed using a second photoresist pattern and a second BARC layer. The gate line, the pad and the select line can be formed at a same time.

17 Claims, 13 Drawing Sheets

METHOD OF FORMING A PATTERN OF A SEMICONDUCTOR DEVICE

CROSS-REFERENCES TO RELATED APPLICATIONS

The present application claims priority to Korean patent application number 10-2007-140295, filed on Dec. 28, 2007, which is incorporated by reference in its entirety.

BACKGROUND OF THE INVENTION

The present invention relates to a method of forming a pattern of a semiconductor device and, more particularly, to a method of forming a pattern of a semiconductor device, in which a gate pattern is formed in a cell region and a peri region at the same time.

A semiconductor device includes a plurality of gate lines (for example, memory cells and transistors) and metal lines. In order to increase the storage capacity of a semiconductor device and miniaturize the semiconductor device, the width of a plurality of patterns including gate lines and metal lines must be narrow.

In general, a patterning process of forming patterns includes forming a hard mask layer on a to-be-etched layer and forming photoresist patterns on the hard mask layer. Hard mask patterns are formed by performing an etch process along the photoresist patterns. The to-be-etched layer can be patterned by performing an etch process along the hard mask patterns.

To form the photoresist patterns, exposure and development processes are carried out. In particular, the width of a pattern is determined according to resolutions of a light source used during the exposure process. That is, there are limits in forming further micro patterns due to the limitation of resolutions.

After the patterns of the cell region are formed, if a Bottom Anti-Reflection Coating (BARC) layer is formed to form patterns of the peri region, a step can occur between the cell region and the peri region due to a difference between the patterns. If the photoresist layer is formed and the exposure process is performed in a state where the step exists, a notching phenomenon can be generated due to scattering of light in the step generating region. Thus, a polishing process for removing the step can be performed. This increases the steps of the fabrication process of the semiconductor device, which can result in increased fabrication costs and extended manufacturing time.

BRIEF SUMMARY OF THE INVENTION

The present invention is directed to forming a gate line, a pad, and a select line at the same time, by forming a pattern for the gate line using a first photoresist pattern and a first BARC layer. A pad and a pattern for the select line, which has a width larger than that of the gate line, are formed using a second photoresist pattern and a second BARC layer.

In a method of forming micro patterns of a semiconductor device in accordance with an embodiment of the present invention, a semiconductor substrate is provided. The semiconductor substrate includes a first region in which a first target pattern is formed and a second region in which a second target pattern having a width larger than that of the first target pattern is formed. A first auxiliary pattern, including a first pattern of the first region, which has a pitch twice as large as that of the first target pattern, and a second pattern of the second region, is formed over the semiconductor substrate. An etch mask layer is formed over the semiconductor substrate including a surface of the first auxiliary pattern. A second auxiliary pattern is formed including a third pattern between the etch mask layers formed on sidewalls of the first pattern and a fourth pattern overlapped with one side of the second pattern. The etch mask layer formed on a top surface of the first auxiliary pattern is removed. The etch mask layer formed on a top surface of the first and second auxiliary patterns is removed. The first and second auxiliary patterns are removed and the etch mask layer is etched, so that a part of the etch mask layer remains in regions where the first target pattern will be formed and the first and second auxiliary patterns and the etch mask layer remain in regions where the second target pattern will be formed.

The formation of the first auxiliary pattern includes forming a first auxiliary layer over the semiconductor substrate; forming first photoresist patterns, including the patterns of the first and second regions, on the first auxiliary layer; etching the first auxiliary layer along the first photoresist patterns; and removing the first photoresist patterns.

The first auxiliary pattern includes a pattern for preventing a step from occurring between the first and second regions when the second auxiliary pattern is formed. The etch mask layer is formed of an oxide layer or a polymer including silicon (Si).

The formation of the second auxiliary pattern includes forming a second auxiliary layer on the etch mask layer; forming second photoresist patterns, including the second target pattern, on the second auxiliary layer; and patterning the second auxiliary layer along the second photoresist patterns.

The first and second auxiliary patterns are formed of a BARC layer. The BARC layer is a flowable BARC layer.

When the first and second auxiliary patterns are removed and the etch mask layer is etched so that a part of the etch mask layer remains in the regions where the first target pattern will be formed, a part of the remaining etch mask layer, which is formed on sidewalls of the first auxiliary patterns, remains.

The remaining of the first and second auxiliary patterns and the etch mask layer in the regions where the second target pattern will be formed includes removing a part of the first and second auxiliary patterns exposed in the second region at the same time when removing the first and second auxiliary patterns in the first region.

After removing the first and second auxiliary patterns and etching the etch mask layer so that a part of the etch mask layer remains in the regions where the first target pattern will be formed and the first and second auxiliary patterns and the etch mask layer remain in the regions where the second target pattern will be formed, mask patterns of the first and second target patterns are formed by isolating edge ends of the remaining etch mask layer.

The method further includes forming a hard mask layer over the etch mask layer before the first auxiliary pattern is formed.

The hard mask layer is formed of a single layer or a multi-layer. The multi-layer has a stacked structure of an amorphous carbon layer, a SiON layer and a polysilicon layer.

The first target pattern comprises a word line pattern, and the second target pattern comprises a select line pattern and a pad pattern.

In a method of forming micro patterns of a semiconductor device in accordance with another embodiment of the present invention, a semiconductor substrate is provided in which a to-be-etched layer is formed. The semiconductor substrate includes a first region in which a first target pattern is formed and a second region in which a second target pattern having a width larger than that of the first target pattern is formed. A first auxiliary pattern, including an auxiliary pattern for preventing a step from occurring between the first region and the second region, is formed over the to-be-etched layer.

The method further includes a second auxiliary pattern in which the second target pattern is formed over the to-be-etched layer in which the first auxiliary pattern, including the auxiliary pattern, is formed.

The method further includes patterning the to-be-etched layer along the first and second auxiliary patterns after the auxiliary pattern is removed. The first and second auxiliary patterns are formed of a BARC layer.

DESCRIPTION OF SPECIFIC EMBODIMENTS

Specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the present invention. The present invention is defined by the scope of the claims.

FIGS. 1A to 1L are first sectional views illustrating a method of forming a pattern of a semiconductor device according to the present invention. FIGS. 2A to 2L are second sectional views illustrating a method of forming a pattern of a semiconductor device according to the present invention. FIGS. 3A to 3L are plan views illustrating a method of forming a pattern of a semiconductor device according to the present invention.

More specifically, the cross sections along line A-A' in FIGS. 3A to 3L are the first sectional views and the cross sections along line B-B' in FIGS. 3A to 3L are the second sectional views. Description is given below with reference to the first and second sectional views and the plan view at the same time.

Figure 1A:
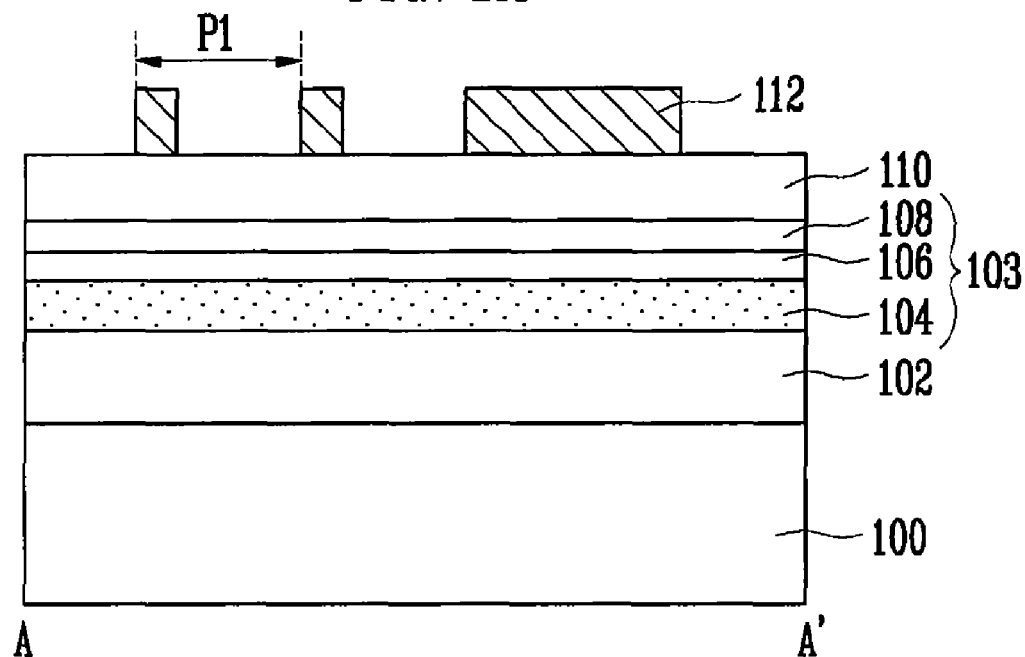
FIGS. 1A to 1L are first sectional views illustrating a method of forming a pattern of a semiconductor device according to the present invention.
Figure 2A:
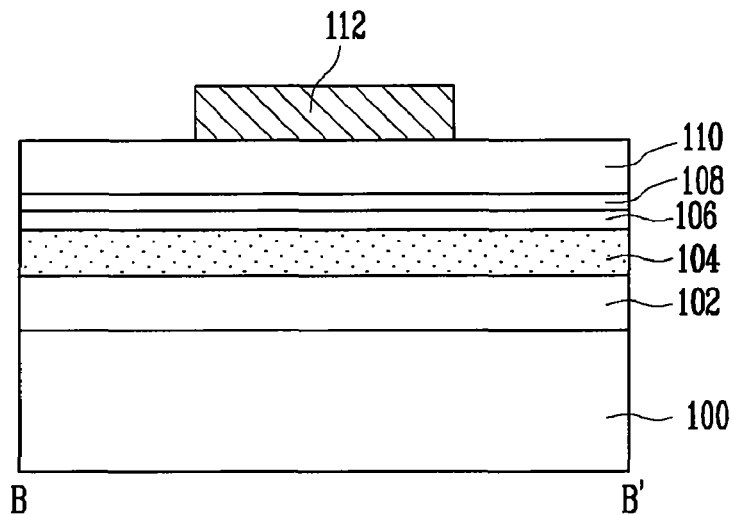
FIGS. 2A to 2L are second sectional views illustrating a method of forming a pattern of a semiconductor device according to the present invention.
Figure 3A:
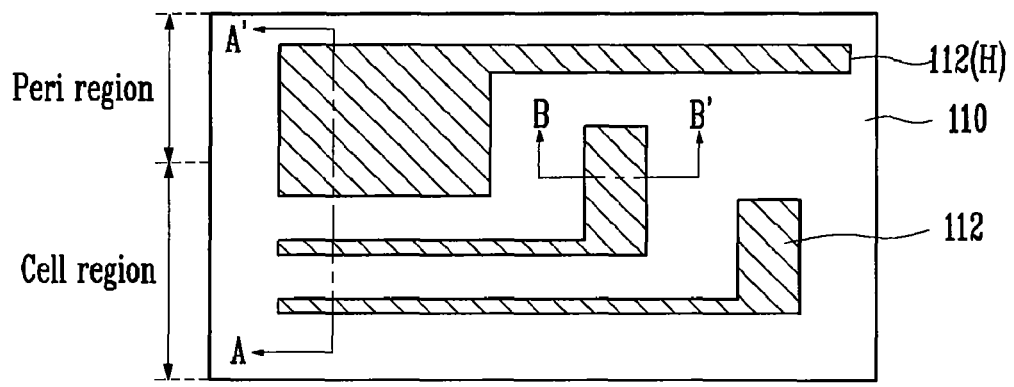
FIGS. 3A to 3L are plan views illustrating a method of forming a pattern of a semiconductor device according to the present invention.

Referring to FIGS. 1A, 2A and 3A, a flash device is described as an example. A semiconductor substrate 100 in which a to-be-etched layer 102 is formed is provided. The to-be-etched layer 102 is a layer to be finally patterned and can be formed by stacking a plurality of layers, for example, an insulating layer and a conductive layer, or by using any one of the layers. In the case where subsequent gate lines are formed by patterning the to-be-etched layer 102, the to-be-etched layer 102 can have a stacked structure of a gate insulating layer, a first conductive layer, a dielectric layer, a second conductive layer and a metal layer.

A hard mask layer 103 is formed on the to-be-etched layer 102. The hard mask layer 103 can be formed using a single layer or a multi-layer. A case where the hard mask layer 103 is formed to have a multi-layer structure of first, second and third hard mask layers 104, 106 and 108 is described below as an example. The first hard mask layer 104 can be formed of an amorphous carbon layer, the second hard mask layer 106 can be formed of a SiON layer, and the third hard mask layer 108 can be formed of a polysilicon layer.

A first auxiliary layer 110 is formed on the third hard mask layer 108. The first auxiliary layer 110 can be formed of, for example, a BARC layer. First photoresist patterns 112 having a different width in a cell region (a first region) and a peri region (a second region), are formed on the first auxiliary layer 110. For example, a photoresist layer of a positive type is formed on the first auxiliary layer 110, and exposure and development processes are performed to thereby form patterns having a first pitch P1 in the cell region. Specifically, the first pitch P1 may be approximately twice as large as a pitch of first target patterns that will be finally formed in the cell region. The reason why the first photoresist pattern 112 is also formed in the peri region is that it can prevent the occurrence of a step H between the cell region and the peri region when forming a subsequent second auxiliary layer (refer to 116 of FIG. 1D).

Figure 1B:
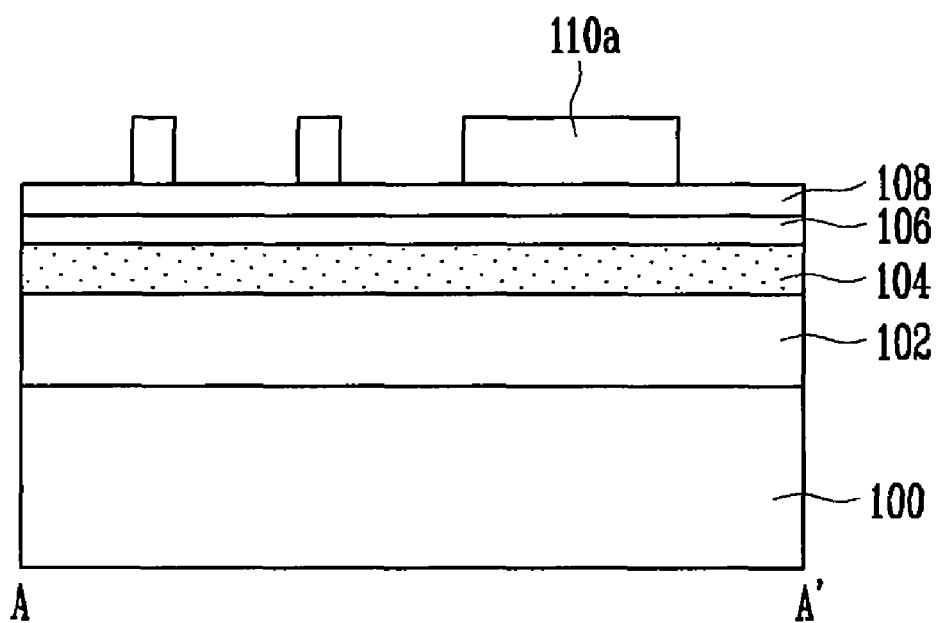
Figure 2B:
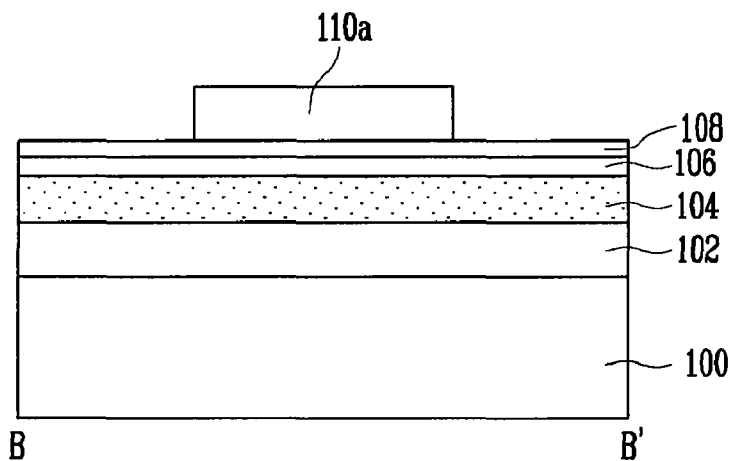
Figure 3B:
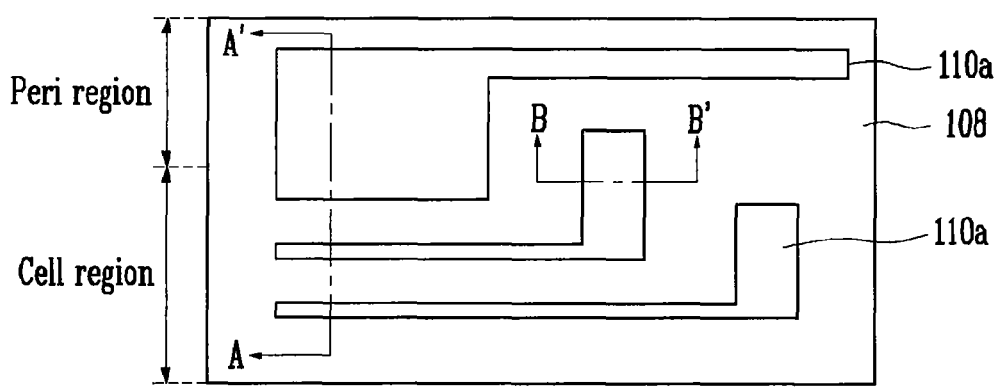

Referring to FIGS. 1B, 2B and 3B, first auxiliary patterns 110a are formed by patterning the first auxiliary layer (refer to 110 of FIG. 1A) along the first photoresist patterns (refer to 112 of FIG. 1A). The first auxiliary patterns 110a also form a subsequent etch mask layer.

The remaining first photoresist patterns (refer to 112 of FIG. 1A) are removed. This is for the purpose of preventing the first photoresist patterns (refer to 112 of FIG. 1A) from being bent or twisted due to a difference in a baking temperature when the first photoresist patterns (refer to 112 of FIG. 1A) remain in a baking process performed after a subsequent second auxiliary layer (refer to 116 of FIG. 1D) is formed. For example, the baking temperature (for example, 200 degrees Celsius) of the BARC layer is higher than that (for example, 100 degrees Celsius) of the photoresist layer.

Figure 1C:
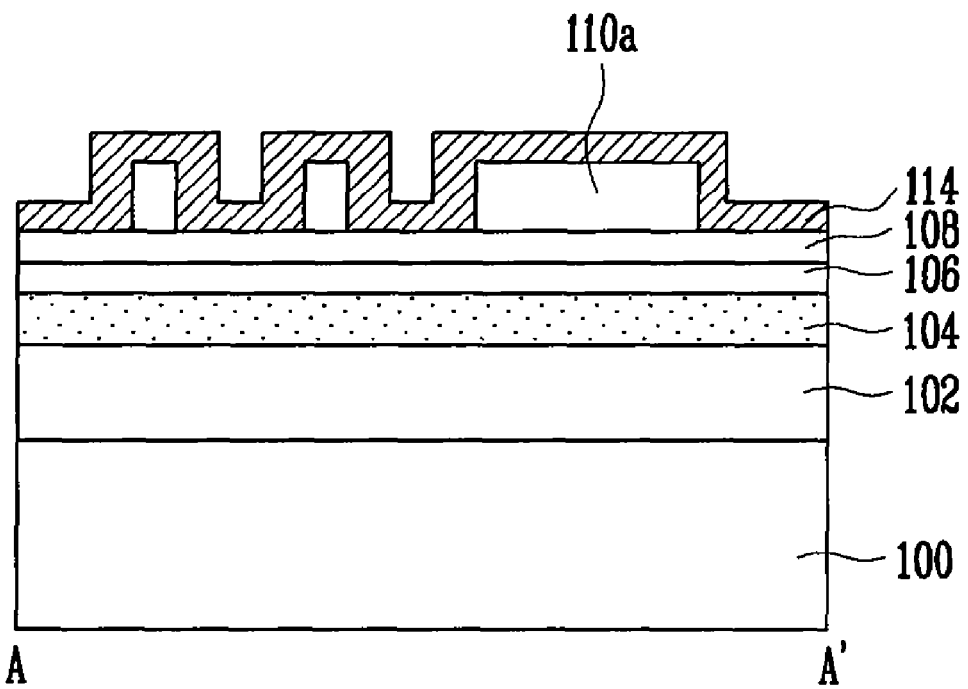
Figure 2C:
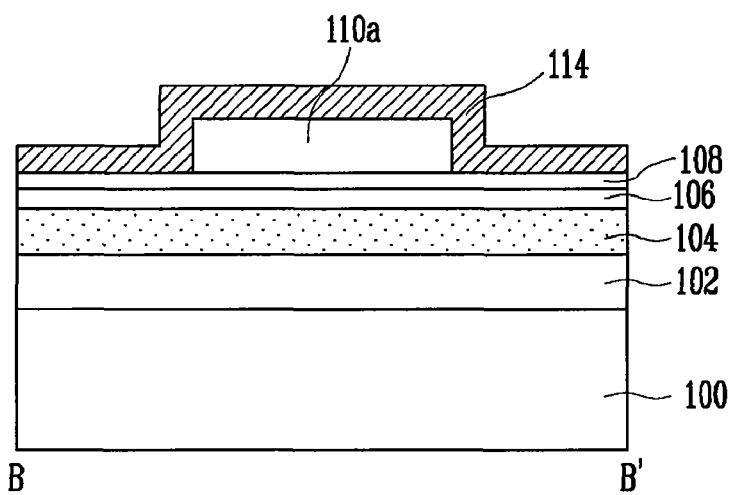
Figure 3C:
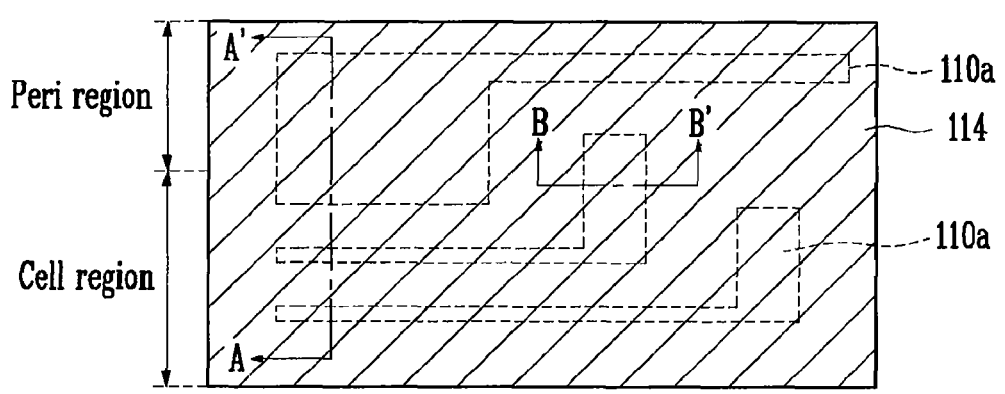

Referring to FIGS. 1C, 2C and 3C, an etch mask layer 114 is formed along a surface of the first auxiliary patterns 110a and the exposed third hard mask layer 108. The etch mask layer 114 may be formed of material having an etch selectivity different from that of the first auxiliary patterns 110a. For example, the etch mask layer 114 may be formed of an oxide layer or a polymer including silicon (Si). The etch mask layer 114 is formed to have the same thickness both in the cell region and the peri region, so it has the same width on sidewalls of the first auxiliary patterns 110a. In particular, the width of the etch mask layer 114 formed on the sidewalls of the first auxiliary patterns 110a in the cell region determines the width of a gate line to be formed in a subsequent cell region.

Figure 1D:
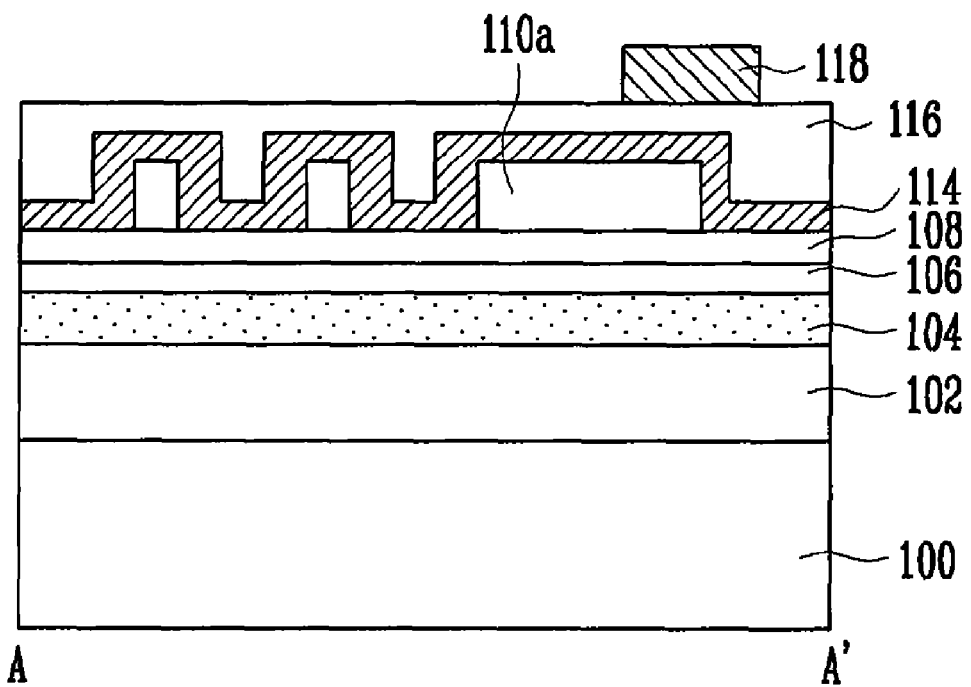
Figure 2D:
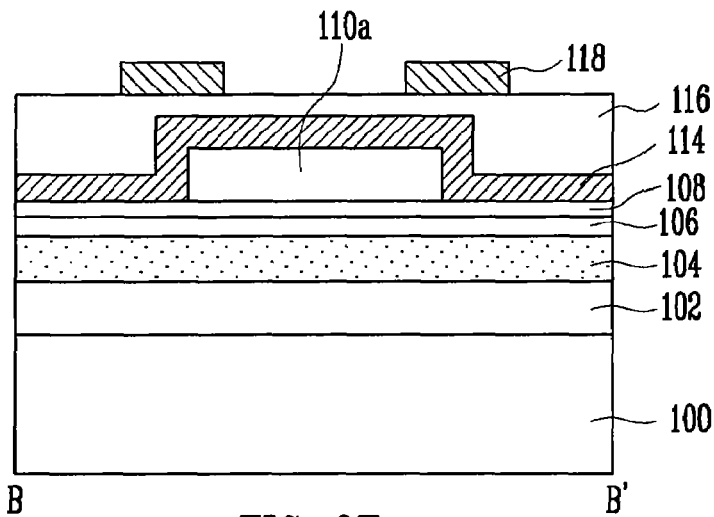
Figure 3D:
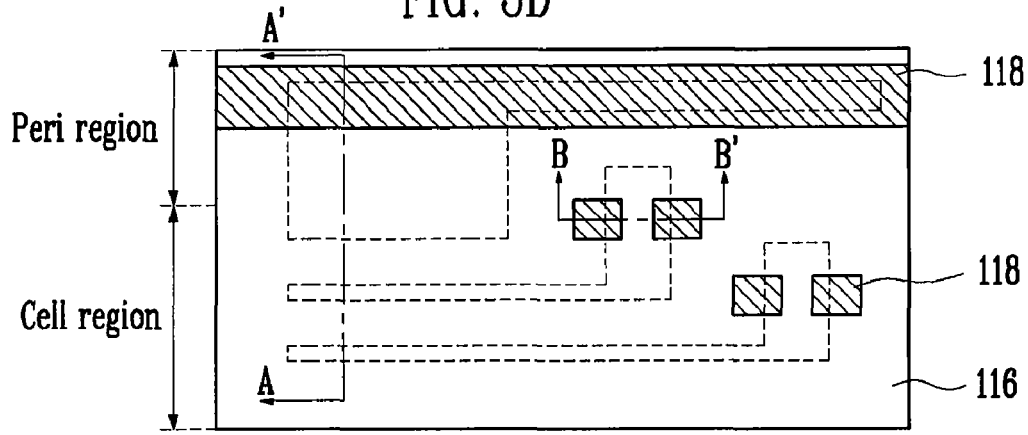

Referring to FIGS. 1D, 2D and 3D, a second auxiliary layer 116 is formed on the etch mask layer 114 formed in the cell region and the peri region. The second auxiliary layer 116 may be formed using a flowable BARC layer to fill the etch mask layer 114 that is upwardly projected. The second auxiliary layer 116 filled between the projected etch mask layer 114 also functions to form subsequent etch mask patterns.

In particular, the first auxiliary pattern 110a is also formed in the peri region. Thus, although the second BARC layer 114 is formed, no step is generated between the cell region and the peri region. Accordingly, a polishing process for reducing the step can be omitted and, therefore, fabrication costs and time can be reduced.

After the second auxiliary layer 116 is formed, a baking process (i.e., an annealing process performed at a temperature of, for example, 200 degrees Celsius) is performed to increase the density of the second auxiliary layer 116.

Second photoresist patterns 118 for forming patterns for a select line and a pad of the peri region are formed on the second auxiliary layer 116. In more detail, the second photoresist pattern 118 of FIG. 1D can be formed as the pattern for the select line, and the second photoresist pattern 118 of FIG. 2D can be formed as the pattern for the pad.

Figure 1E:
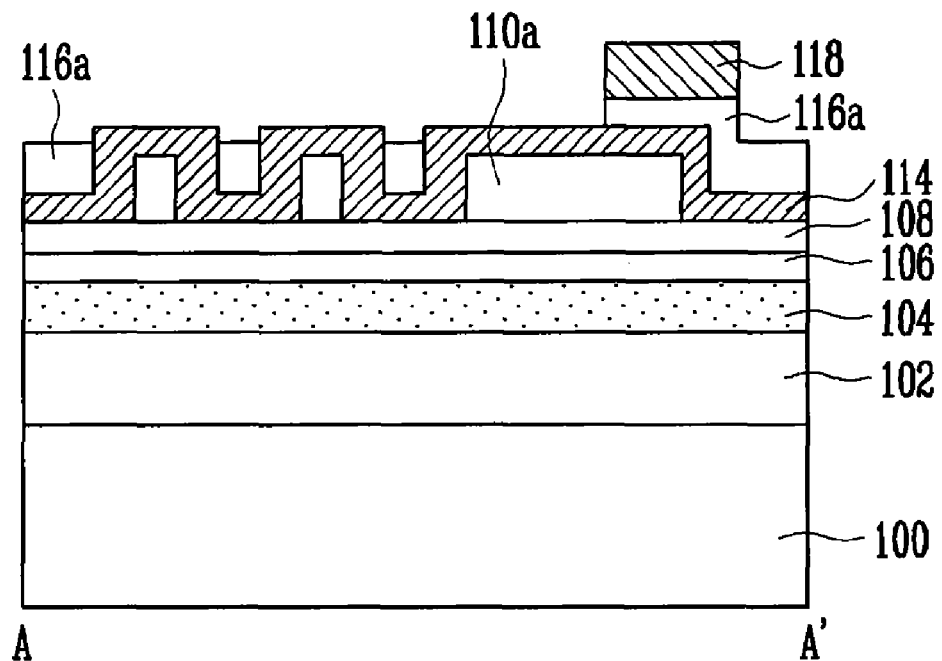
Figure 2E:
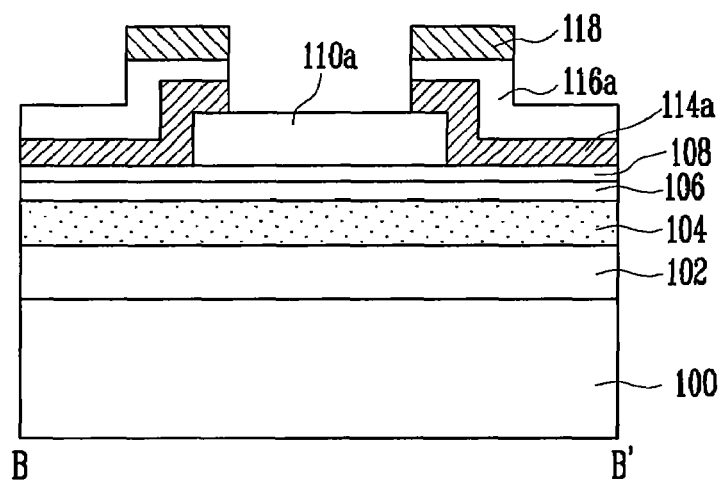
Figure 3E:
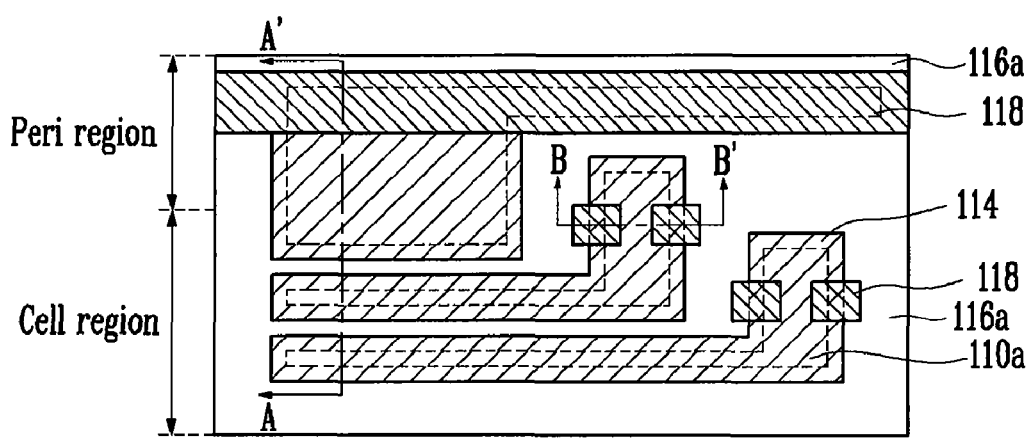

Referring to FIGS. 1E, 2E and 3E, second auxiliary patterns 116a are formed by etching the second auxiliary layer (refer to 116 of FIG. 1D) along the second photoresist patterns 118. Specifically, an etch process is performed along the second photoresist patterns 118. An etch process using a higher etch selectivity with respect to the second auxiliary patterns 116a than that of the etch mask layer 114 is performed so that a top surface of the etch mask layer 114 formed on the first auxiliary patterns 110a is exposed. Thus, a part of the second auxiliary patterns 116a remain between the projected etch mask layers 114.

Figure 1F:
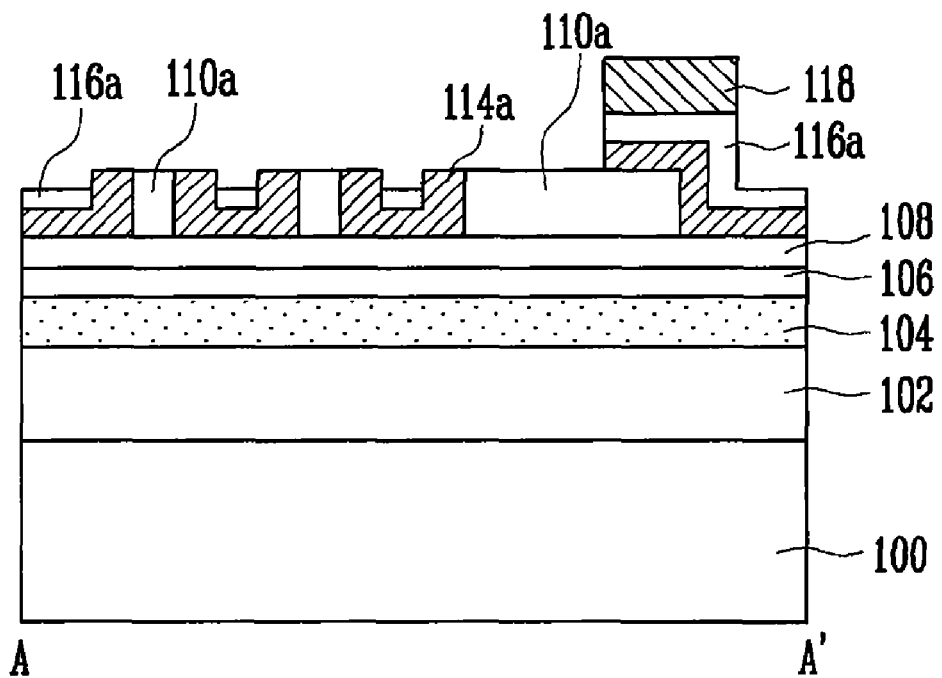
Figure 2F:
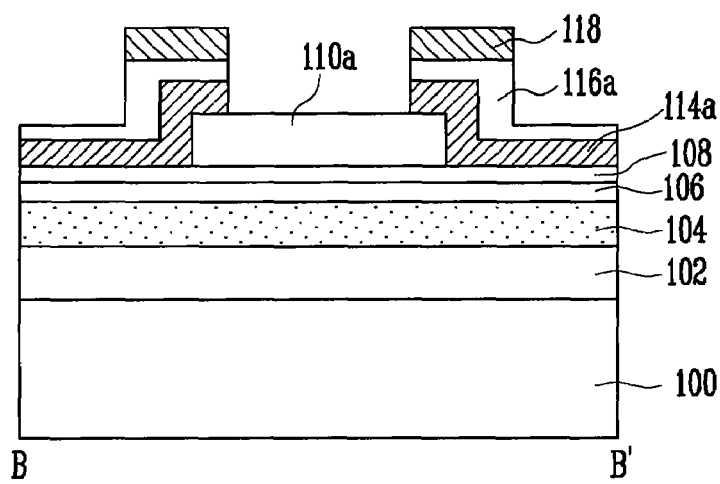
Figure 3F:
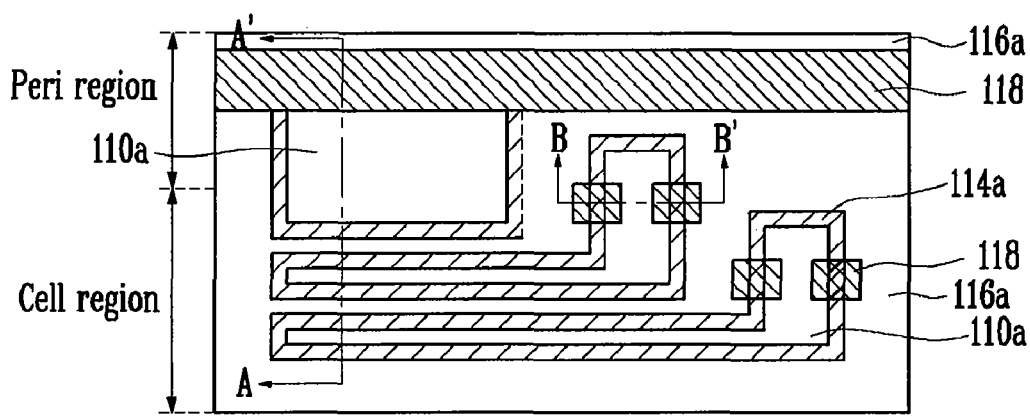

Referring to FIGS. 1F, 2F and 3F, an etch process is performed along the second photoresist patterns 118 to remove the etch mask layer (refer to 114 of FIG. 1E) remaining on the first auxiliary patterns 110a. Thus, etch mask patterns 114a can be formed. The etch process is performed using a higher etch selectivity with respect to the etch mask patterns 114 than that of the first and second auxiliary patterns 110a and 116a. When the top surface of the first auxiliary patterns 110a is exposed, the etch process is stopped.

Figure 1G:
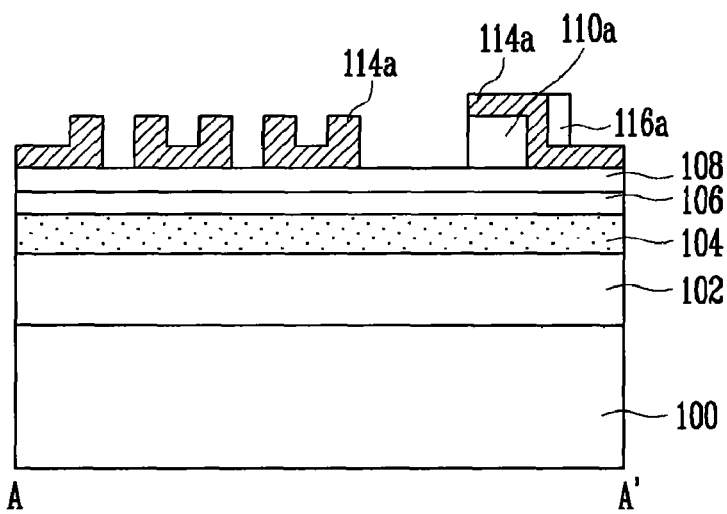
Figure 2G:
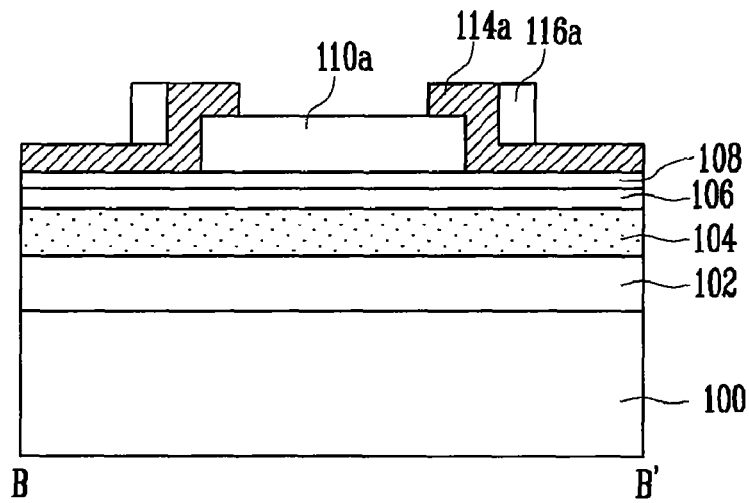
Figure 3G:
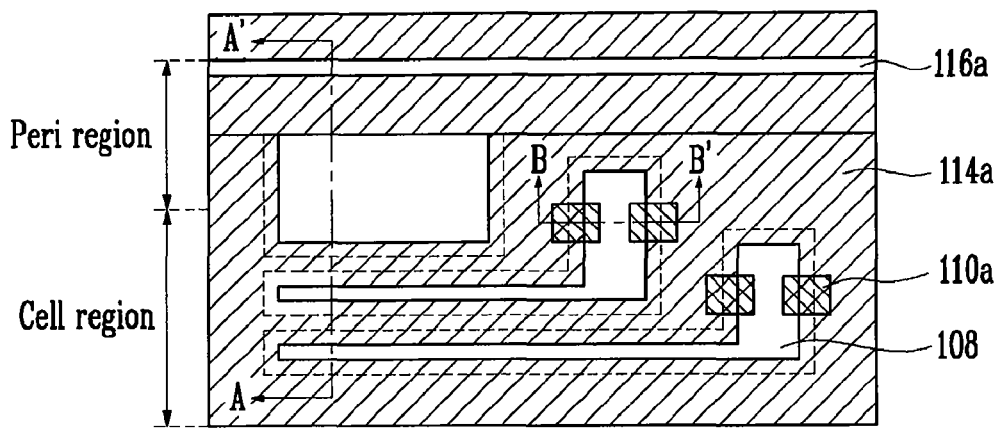

Referring to FIGS. 1G, 2G and 3G, the first auxiliary patterns (refer to 110a of FIG. 1F) and the second auxiliary patterns (refer to 116a of FIG. 1F), which are exposed, are removed by performing a blanket etch process, thereby exposing a part of the third hard mask layer 108. A part of the second auxiliary patterns 116a may remain in the select line region and the pad region.

Figure 1H:
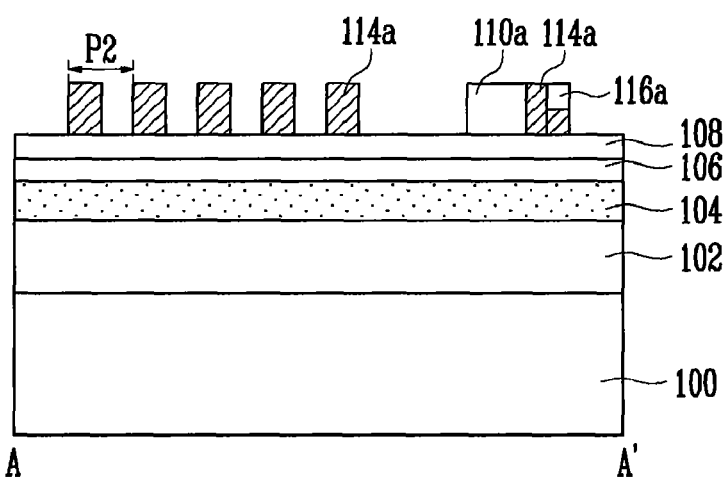
Figure 2H:
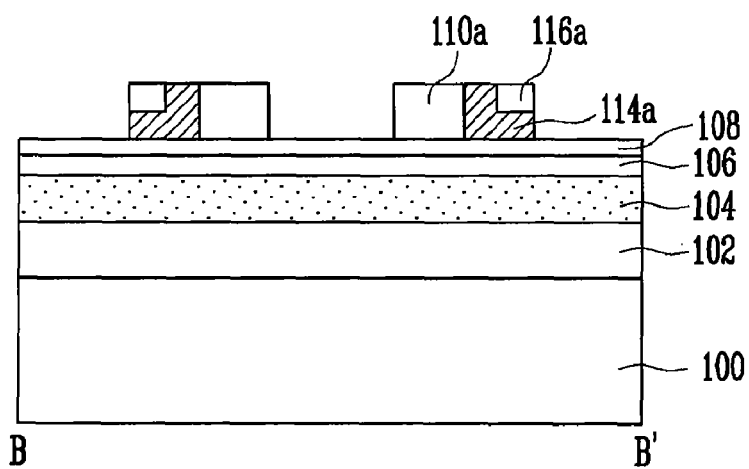
Figure 3H:
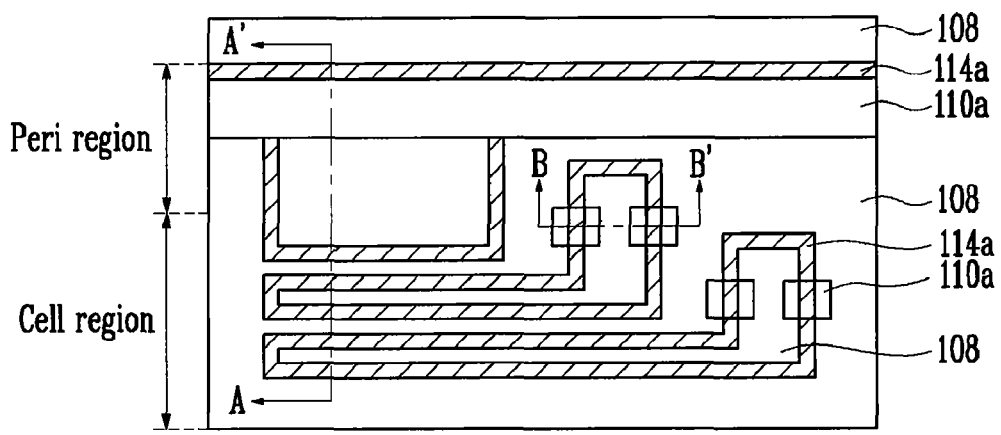

Referring to FIGS. 1H, 2H and 3H, a part of the etch mask patterns 114a is removed by performing an etch process employing a difference in the thickness of the remaining etch mask patterns 114a.

Specifically, a thickness of a portion remaining at the bottom of the etch mask patterns 114a is thinner than that of an upwardly projecting portion. Thus, if an etch process is performed, the portion remaining at the bottom is first removed and the upwardly projecting portion remains.

Hence, the etch mask pattern 114a remains in the cell region with a second pitch P2, which is approximately half the first pitch P1. A part of the etch mask pattern 114a and a part of the first and second auxiliary patterns 110a and 116a, remaining in the peri region, have a width that is larger than that of the second pitch P2. For example, the etch mask pattern 114a and the first and second auxiliary patterns 110a and 116a, which remain in the peri region of FIG. 1H and form one pattern, can become patterns for select lines, and the etch mask pattern 114a and a part of the first and second auxiliary patterns 110a and 116a, which remain in FIG. 2H, can become patterns for pads.

Figure 1I:
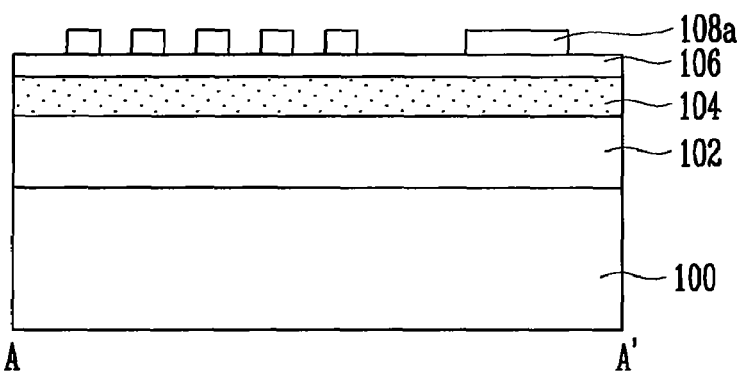
Figure 1J:
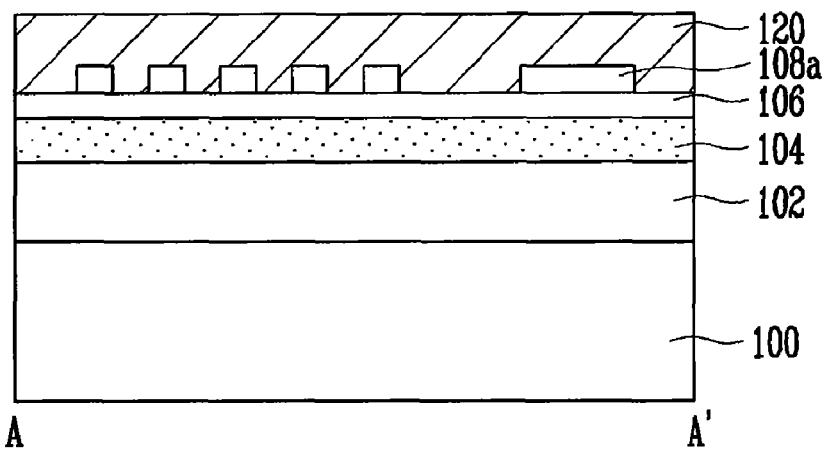
Figure 2I:
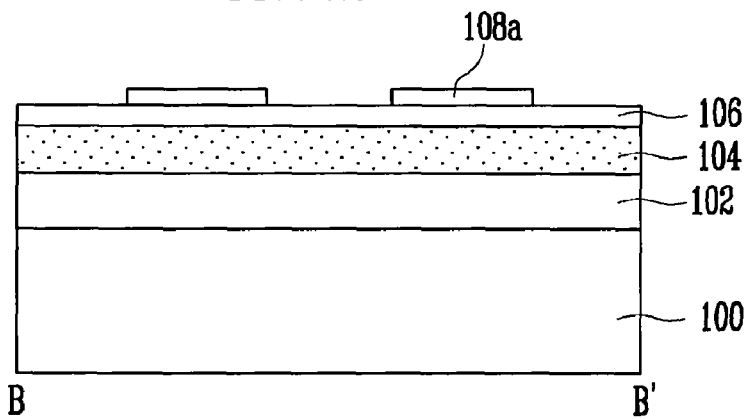
Figure 2J:
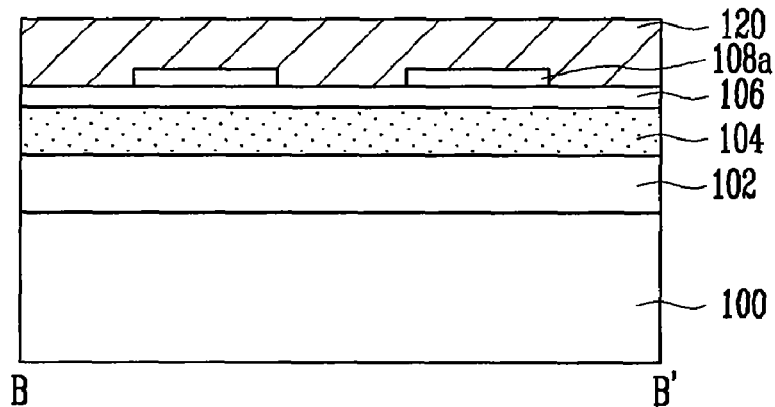
Figure 3I:
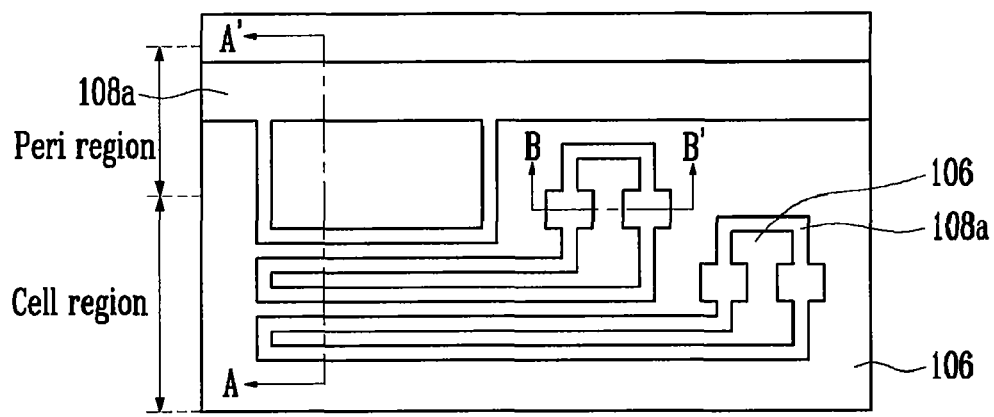

Referring to FIGS. 1I, 2I and 3I, third hard mask patterns 108a are formed by etching the third hard mask layer (refer to 108 of FIG. 1H) along the etch mask patterns 114a and the first and second auxiliary patterns 110a and 116a. The remaining etch mask patterns 114a and the remaining first and second auxiliary patterns 110a and 116a are then removed. Accordingly, the third hard mask patterns 108 form patterns having a different width in the cell region and the peri region.

Figure 3J:
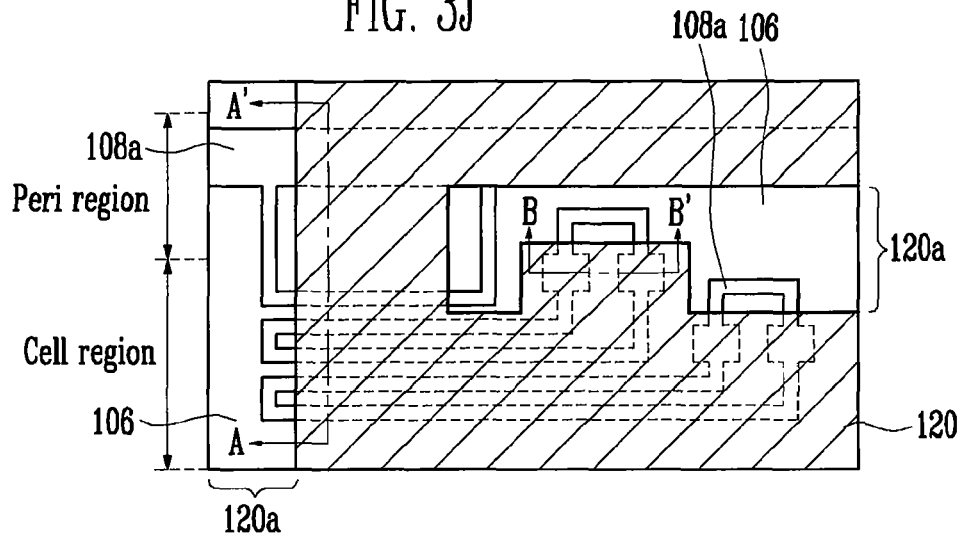

Referring to FIGS. 13, 23 and 3J, in order to isolate regions connected at edge portions of the third hard mask patterns 108a, a third photoresist pattern 120 in which regions 120a to be isolated are opened is formed on the third hard mask patterns 108a and the second hard mask layer 106. An etch process using a higher etch selectivity with respect to the third hard mask patterns 108a than that with respect to the second hard mask layer 106 is performed to remove the third hard mask patterns 108a exposed in the interconnect region 120a.

Figure 1K:
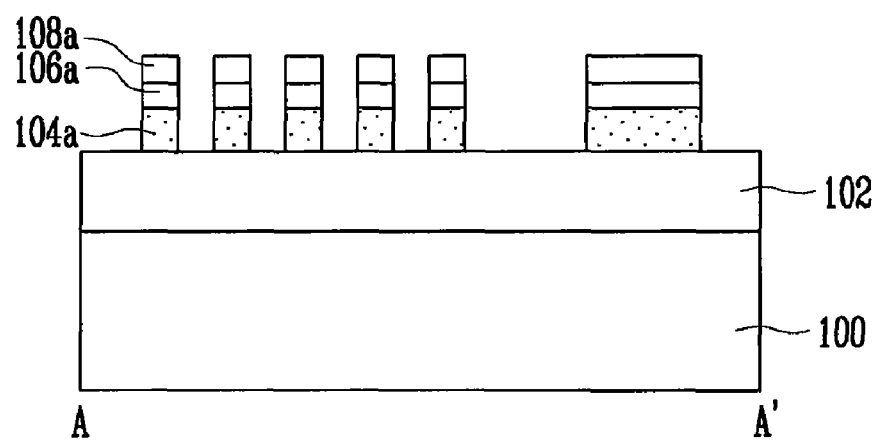
Figure 2K:
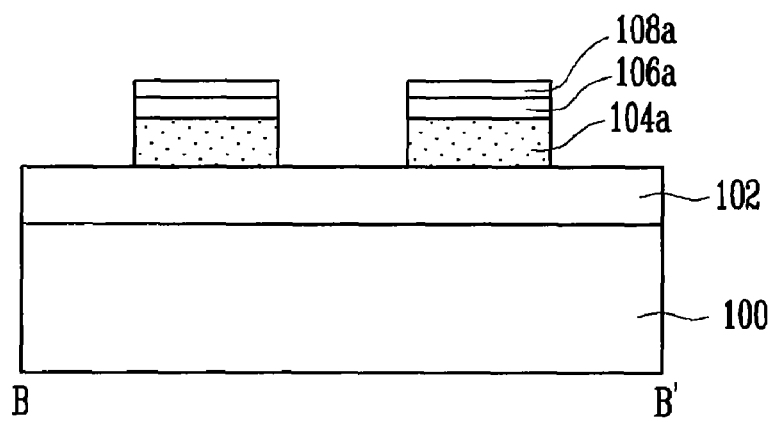
Figure 3K:
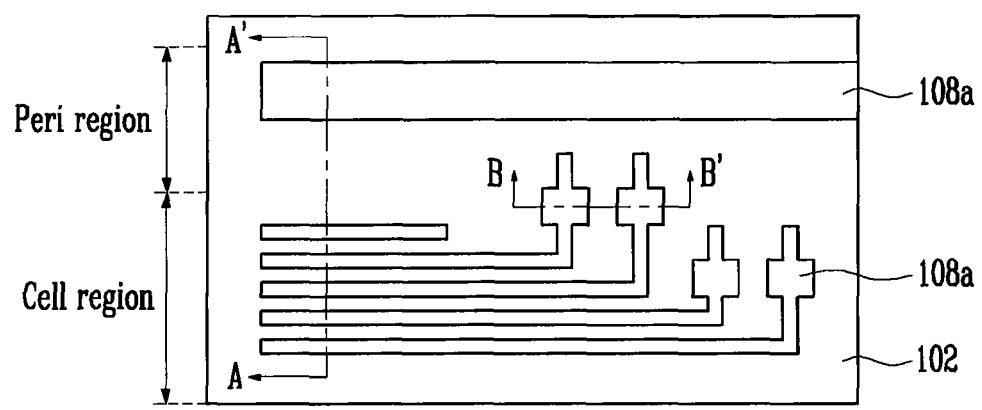

Referring to FIGS. 1K, 2K and 3K, the third photoresist patterns 120 are removed. Thus, the third hard mask patterns 108a having a different width can be formed. For example, a pattern formed in the cell region of the third hard mask patterns 108a, can become a gate mask pattern for forming a pattern for a word line. A pattern formed in the peri region of the third hard mask patterns 108a, can become a gate mask pattern for a select line, which has a width that is larger than that of the word line. A pattern shown in FIG. 2K of the third hard mask patterns 108a can become a mask pattern for a pad.

The second hard mask layer (refer to 106 of FIG. 1J) and the first hard mask layer (refer to 104 of FIG. 1J) are sequentially patterned along the third hard mask patterns 108a, thereby forming second hard mask patterns 106a and first hard mask patterns 104a.

Figure 1L:
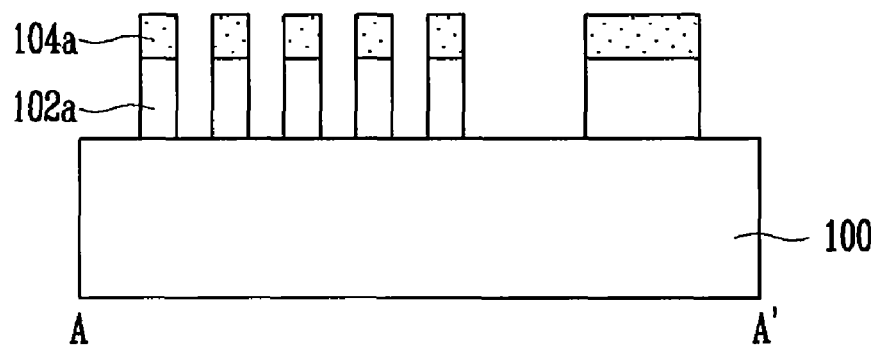
Figure 2L:
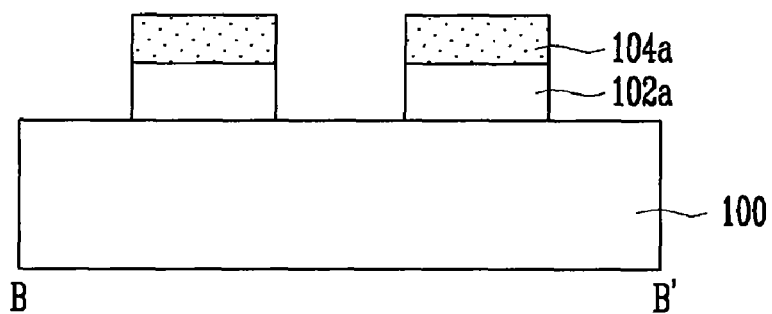
Figure 3L:
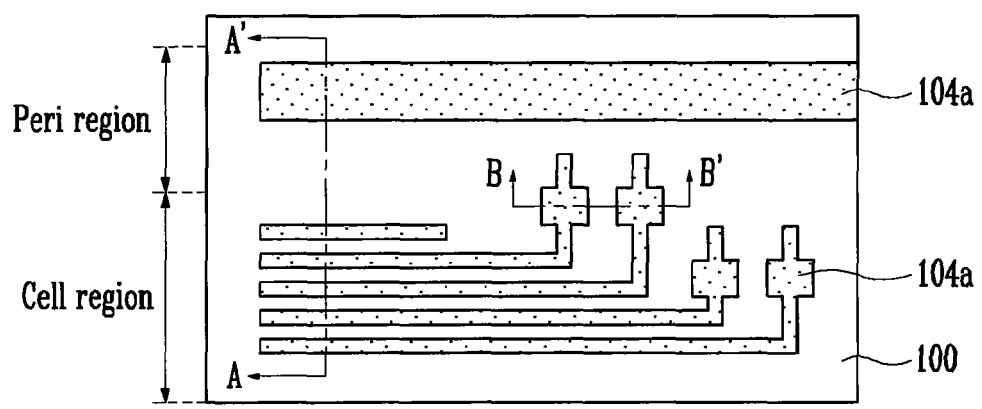

Referring to FIGS. 1L, 2L and 3L, the to-be-etched layer (refer to 102 of FIG. 1K) is patterned by performing an etch process along the first, second and third hard mask patterns 104a, 106a and 108a. Thus, to-be-etched layer patterns 102a can be formed. The third and second hard mask patterns (refer to 108a and 106a of FIG. 1K) may be removed during the etch process.

Alternatively, after the etch mask patterns 114a and the first and second auxiliary patterns 110a and 116a are formed over the to-be-etched layer 102 (refer to FIG. 1H) without forming the hard mask layer (refer to 103 of FIG. 1A), the to-be-etched layer 102 can be patterned by performing an etch process along the etch mask patterns 114a and the first and second auxiliary patterns 110a and 116a.

As described above, according to the present invention, a pattern for a gate line is formed using the first photoresist pattern and the first BARC layer, and patterns for a pad and a select line, which have a width larger than that of the gate line, are formed using the second photoresist pattern and the second BARC layer. Accordingly, the gate line, the pad and the select line can be formed at the same time.

Furthermore, a polishing process between the cell region and the peri region for a patterning process can be omitted and micro patterns can be formed without replacing an exposure apparatus. Accordingly, expense and time consumed for a fabrication process can be reduced.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A method of forming micro patterns of a semiconductor device, the method comprising:
providing a semiconductor substrate, wherein the semiconductor substrate includes a first region and a second region;
forming first auxiliary patterns over the semiconductor substrate, wherein the first auxiliary patterns include first patterns in the first region and second patterns in the second region;
forming an etch mask layer along a surface of a resulting structure after formation the first auxiliary pattern;
forming a second auxiliary layer over the etch mask layer;
forming second photoresist patterns over the second auxiliary layer, wherein the second photoresist patterns are formed on portions of the first auxiliary patterns and portions of the etch mask layer in the second region;

etching the second auxiliary layer using the second photoresist patterns as an etch mask to form second auxiliary patterns that expose portions of the etch mask layer formed on the first auxiliary patterns;

removing the exposed etch mask layer, thereby exposing top surfaces of the first auxiliary patterns; and etching portions of the etch mask layer to form first target patterns in the first region and second target patterns in the second region, wherein the second target patterns include at least a portion of the second auxiliary patterns.

2. The method of claim 1, wherein forming the first auxiliary patterns comprises:

forming a first auxiliary layer over the semiconductor substrate;

forming first photoresist patterns on the first auxiliary layer, wherein the first photoresist patterns include the patterns of the first and second regions;

etching the first auxiliary layer along the first photoresist patterns; and removing the first photoresist patterns.

3. The method of claim 1, wherein the first auxiliary patterns includes patterns for preventing a step from occurring between the first and second regions when the second auxiliary patterns are formed.

4. The method of claim 1, wherein the etch mask layer is formed of an oxide layer or a polymer including silicon (Si).

5. The method of claim 1, wherein the first and second auxiliary patterns are formed of a Bottom Anti-Reflective Coating (BARC) layer.

6. The method of claim 5, wherein the BARC layer is a flowable BARC layer.

7. The method of claim 1, wherein when the first and second auxiliary patterns are removed and the etch mask layer is etched so that a part of the etch mask layer remains in the regions where the first target patterns will be formed, a part of the remaining etch mask layer formed on sidewalls of the first auxiliary patterns remains.

8. The method of claim 1, wherein the remaining of the first and second auxiliary patterns and the etch mask layer in the regions where the second target patterns will be formed includes removing a part of the first and second auxiliary patterns exposed in the second region when removing the first and second auxiliary patterns in the first region.

9. The method of claim 1, wherein after removing the first and second auxiliary patterns and etching the etch mask layer so that a part of the etch mask layer remains in the regions where the first target patterns will be formed and the first and second auxiliary patterns and the etch mask layer remain in the regions where the second target patterns will be formed, mask patterns of the first and second target patterns are formed by isolating edge ends of the remaining etch mask layer.

10. The method of claim 1, further comprising forming a hard mask layer over the etch mask layer before the first auxiliary patterns are formed.

11. The method of claim 10, wherein the hard mask layer is formed of a single layer or a multi-layer.

12. The method of claim 11, wherein the multi-layer of the hard mask layer has a stacked structure of an amorphous carbon layer, a SiON layer and a polysilicon layer.

13. The method of claim 1, wherein:
the first target patterns comprise word line patterns, and
the second target patterns comprise select line patterns and pad patterns.

14. A method of forming micro patterns of a semiconductor device, the method comprising:

providing a semiconductor substrate having a layer in which first target patterns and second target patterns will be formed, wherein a width of the second target patterns is different from that of the first target patterns;

forming first auxiliary patterns over the layer to expose portions of the layer;

forming an etch mask layer along a surface of the first auxiliary patterns and the exposed layer;

forming a flowable bottom anti-reflective coating layer on the etch mask layer;

forming photoresist patterns over the flowable bottom anti-reflective coating layer, the photoresist patterns matching the second target patterns;

patterning the flowable bottom anti-reflective coating layer using the photoresist patterns as an etch mask to form second auxiliary patterns that expose portions of the etch mask layer, wherein portions of the flowable bottom anti-reflective coating layer are remained between the etch mask layer;

etching the etch mask layer until the first auxiliary patterns is exposed, wherein portions of the etch mask layer are remained on sidewalls of the first auxiliary patterns;

etching the exposed first and second auxiliary patterns to expose portions of the etch mask layer;

etching portions of the etch mask layer, thereby remaining portions of the etch mask layer in the first and second regions; and patterning the layer to form the first target patterns and the second target patterns by using an etch mask that includes the remained portions of the etch mask layer and at least a portion of the etched second auxiliary patterns.

15. The method of claim 14, wherein the layer in which the first target patterns will be formed is patterned using the remained portions of the etch mask layer, and the layer in which the second target patterns will be formed is patterned using the remained portions of the etch mask layer, the remained first auxiliary patterns and the remained second auxiliary patterns.

16. A method of forming micro patterns of a semiconductor device, the method comprising:

providing a semiconductor substrate having a layer in which word lines, select lines and pad patterns will be formed, wherein a width of the select lines and the pad patterns is larger than that of the word lines;

forming first auxiliary patterns over the layer to expose portions of the layer;

forming an etch mask layer along a surface of the first auxiliary patterns and the exposed layer;

forming a flowable bottom anti-reflective coating layer on the etch mask layer;

forming photoresist patterns over the flowable bottom anti-reflective coating layer, wherein the photoresist patterns include patterns of the select lines and the pad patterns;

patterning the flowable bottom anti-reflective coating layer using the photoresist patterns as an etch mask to form second auxiliary patterns that expose portions of the etch mask layer;

etching the exposed etch mask layer until the first auxiliary patterns are exposed, wherein portions of the etch mask layer are remained on sidewalls of the first auxiliary patterns;

etching the exposed first auxiliary patterns to expose portions of the etch mask layer;

etching portions of the etch mask layer, thereby remaining portions of the etch mask layer; and patterning the layer to form the word lines, the select lines, and the pad patterns by using an etch mask that includes the remained portions of the etch mask layer and at least a portion of the second auxiliary patterns.

17. The method of claim 16, wherein the layer in which the word lines will be formed is patterned by using the remained portions of the etch mask layer, and the layer in which the select lines and the pad patterns will be formed is patterned by using the remained portions of the etch mask layer, the remained first auxiliary patterns, and the remained second auxiliary patterns.

* * * * *